United States Patent [19]
Takeuchi

[11] Patent Number: 6,108,265
[45] Date of Patent: Aug. 22, 2000

[54] SEMICONDUCTOR MEMORY

[75] Inventor: Kei Takeuchi, Tokyo, Japan

[73] Assignee: NEC Corporation, Tokyo, Japan

[21] Appl. No.: 09/436,162

[22] Filed: Nov. 9, 1999

[30] Foreign Application Priority Data

Nov. 9, 1998 [JP] Japan .................................. 10-317628

[51] Int. Cl.⁷ .................................................... G11C 8/00
[52] U.S. Cl. ................ 365/230.03; 365/236; 365/230.04
[58] Field of Search .......................... 365/230.03, 230.06, 365/230.04, 236, 238.5, 185.11

[56] References Cited

U.S. PATENT DOCUMENTS

| | | | |
|---|---|---|---|
| 5,864,505 | 1/1999 | Higuchi .............................. | 365/230.03 |
| 6,011,745 | 1/2000 | Okamura ............................ | 365/230.03 |

*Primary Examiner*—Tan T. Nguyen
*Attorney, Agent, or Firm*—Scully, Scott Murphy & Presser

[57] ABSTRACT

A semiconductor memory comprises two banks each including a number of memory cells arranged in the form of a matrix having a plurality of rows and a plurality of columns, each of the banks having a plurality of data input/output lines extending in a column direction, so that the data input/output lines can sequentially accessed at a designated row address. The semiconductor memory also comprises a bank judgment circuit receiving an address signal for discriminating a first bank to be firstly accessed of the at least two banks, a row address counter for designating a row address at which the first bank is continuously accessed, and a bank switch circuit for switching access to a second bank to continuously access to the second bank after an access to the most significant column address in the first bank has been finished. Thus, a reading or writing operation is continuously executed for the first bank and the second bank by alternately accessing the first bank and the second bank.

4 Claims, 2 Drawing Sheets

SEMICONDUCTOR MEMORY

BACKGROUND OF THE INVENTION

The present invention relates to a semiconductor memory, and more specifically to a semiconductor memory so configured to receive and output data in synchronism with an input clock.

Recently, with a high processing speed in an image processor, a memory capable of reading and writing an image data at a high speed has become demanded. As one means for meeting with this demand, a high speed DRAM (dynamic random access memory) called a "synchronous DRAM" or a "synchronous graphic DRAM" is coming into a wide use.

For example, the synchronous DRAM includes two banks having independent address spaces, respectively, so that each bank can operate independently of the other. In addition, the synchronous DRAM realizes a high speed access of data by a burst operation in which data in continuous addresses in the same row space is sequentially accessed.

However, in controlling the conventional synchronous memory such as the synchronous DRAM, a reading or writing operation is executed in response to a plurality of commends in combination from a CPU (central processing unit) or another. Therefore, some operation is repeatedly executed, it is necessary to repeatedly supply a corresponding train of commands. Accordingly, in order to increase the efficiency of data processing by the burst operation, namely, by a processing typified by a bank interleaving, it is necessary to request a complicated processing to a memory controller. Here, a control command is an operation instruction to the memory, and instructs, for example, an activation of a word line corresponding to a given row address, a precharging of bit lines, for an accessing to an memory cell designated by an address signal, in some bank.

Furthermore, a recent tendency of the synchronous DRAM is that the operation frequency has already exceeded 100 MHz and is going to further reach 125 MHz or 143 MHz, with the result that the control command train becomes further complicated. This has become a large load on the memory controller.

BRIEF DESCRIPTION OF THE INVENTION

Accordingly, it is an object of the present invention to provide a semiconductor memory which has overcome the above mentioned problem of the prior art.

Another object of the present invention is to provide a semiconductor memory capable of avoiding inconvenience that the control command trains become a heavy load in an access control when the operation frequency is further elevated.

Still another object of the present invention is to provide a semiconductor memory capable of continuously and ceaselessly executing a reading or writing operation over a plurality of banks.

The above and other objects of the present invention are achieved in accordance with the present invention by a semiconductor memory comprising:

at least two banks each including a number of memory cells arranged in the form of a matrix having a plurality of rows and a plurality of columns, each of the banks having a plurality of data input/output lines extending in a column direction, so that the data input/output lines can sequentially accessed at a designated row address;

a bank judgment circuit receiving an address signal for discriminating a first bank to be firstly accessed of the at least two banks;

a row address counter for designating a row address at which the first bank is continuously accessed; and a bank switch means for switching access to a second bank to continuously access to the second bank after an access to the most significant column address in the first bank has been finished;

whereby a reading or writing operation is continuously executed for the first bank and the second bank by alternately accessing the first bank and the second bank.

With the above mentioned arrangement, in a circuit operating in synchronism with an externally supplied clock, the row address counter increments the row address to be accessed in the respective bank, so that each bank is accessed in units of one row. When the first bank is accessed, the bank switch means activates the row address to be next accessed in the second bank, and when the bank switch means switches access from the first bank to the second bank, the bank switch means activates the row address to be next accessed in the first bank.

Thus, differently from the prior art semiconductor memory operating based on complicated commands from a CPU or another, the semiconductor memory in accordance with the present invention can automatically continuously execute the reading or writing operation between the first bank and the second bank if it receives a special control command from the CPU or another. Therefore, even if the operating frequency is further elevated, the semiconductor memory in accordance with the present invention can avoid inconvenience that the control command trains become a heavy load in an access control. Furthermore, since the reading or writing operation can be continuously executed for the whole of the memory cell arrays, regardless of the column length in one row address, when a large amount of data can be continuously read or written, efficiency of the control commands can be increased.

In one embodiment, the first bank is a low place bank in a bank address, and the second bank is a high place bank in the bank address. When the access is shifted from the low place bank to the high place bank, the bank switch means activates the same row address, and when the access is shifted from the high place bank to the low place bank, the bank switch means activates a row address next to the row address for which the access was finished. In this case, the address to which data has been already written is prevented from being accessed next, so that a smooth reading or writing operation is obtained.

In another embodiment, the first bank is a low place bank in a bank address, and the second bank is a high place bank in the bank address. When the access is shifted from the high place bank to the low place bank, the bank switch means activates the same row address, and when the access is shifted from the low place bank to the high place bank, the bank switch means activates a row address next to the row address for which the access was finished. Also in this embodiment, the address to which data has been already written is prevented from being accessed next, so that a smooth reading or writing operation is obtained.

According to the present invention, there is also provided a semiconductor memory comprising at least two banks each including a number of memory cells arranged in the form of a matrix having a plurality of rows and a plurality of columns, each of the banks having a plurality of data input/output lines extending in a column direction, so that the data input/output lines can sequentially accessed at a designated row address, wherein the semiconductor memory is configured to receive an address signal for discriminating a first bank to be firstly accessed of the at least two banks, and to designate a row address at which the first bank is continuously accessed, and after an access to the most significant column address in the first bank has been finished, the semiconductor memory switches access to a second bank to continuously access to the second bank, whereby a reading or writing operation is continuously executed for the first bank and the second bank by alternately accessing the first bank and the second bank.

Thus, even if the operating frequency is further elevated, it is possible to avoid inconvenience that the control command trains become a heavy load in an access control, and to continuously execute the reading or writing operation for a plurality of memory cell banks.

The above and other objects, features and advantages of the present invention will be apparent from the following description of preferred embodiments of the invention with reference to the accompanying drawings.

DETAILED DESCRIPTION OF THE INVENTION

Figure 1:
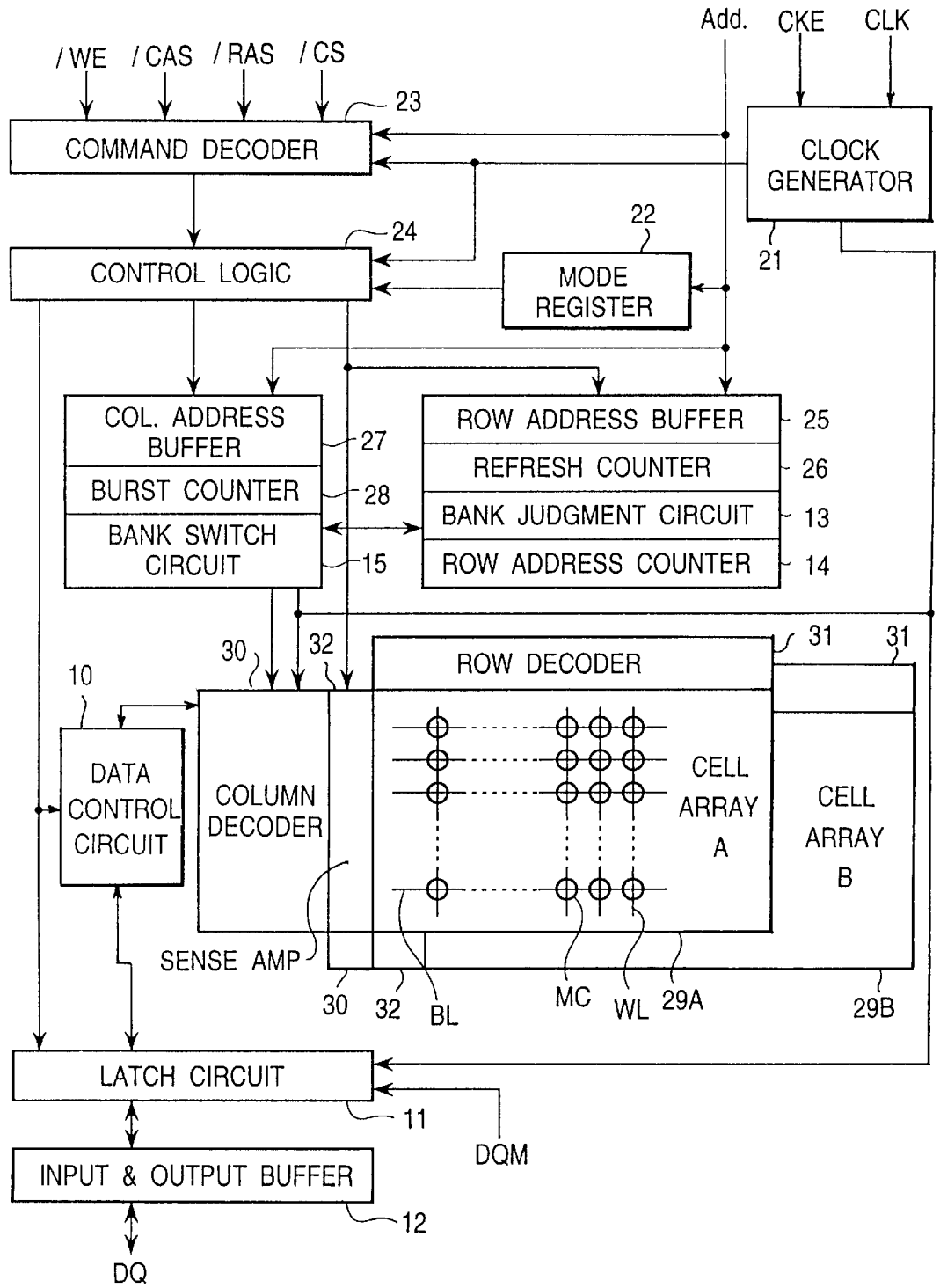
FIG. 1 is a block diagram for illustrating a circuit construction of a first embodiment of the semiconductor memory in accordance with the present invention.

Referring to FIG. 1, there is shown a block diagram for illustrating a circuit construction of a synchronous DRAM which is a first embodiment of the semiconductor memory in accordance with the present invention.

The shown semiconductor memory comprises a main memory including memory cell arrays 29A and 29B, each of which is composed of a number of memory cells MC arranged in the form of a matrix having a plurality of rows and a plurality of columns. In other words, the memory cells MC are located at intersections between a plurality of word lines WL and a plurality of bit lines BL, respectively. The memory cell arrays 29A and 29B constitute a bank A and a bank B, respectively. Each of the bank A and the bank B includes a row decoder 31 for selecting a row designated by a given row address, a column decoder 30 for selecting a column designated by a given column address, and a sense amplifier 32 for reading a content stored in a selected memory cell. Namely, the row decoder 31 selectively activates a word line corresponding to the given row address, and the column decoder 30 selects a bit line corresponding to the given column address.

In the shown embodiment, the bank A and the bank B includes an address equal to each other in a row direction, and the bank A constitutes a low place address in connection with a bank address, and the bank B constitutes a high place address in connection with the bank address. Furthermore, the bank A and the bank B include data input/output lines extending from the bit lines BL in a column direction. The semiconductor memory is so configured that memory cells positioned in a designated row address are sequentially accessed.

The shown semiconductor memory also comprises a clock generator 21, a mode register 22, a command decoder 23 a control logic circuit 24, a row address buffer 25, a refresh counter 26, a column address buffer 27, a burst counter 28, a bank judgment circuit (bank discrimination circuit) 13, a row address counter 14 and a bank switch circuit 15, which are coupled as shown in FIG. 1.

The clock generator 21 receives a clock signal CLK and a clock enable signal CKE, and supplies a clock signal to the command decoder 23, the control logic circuit 24, the bank switch circuit 15 and a latch circuit 11, respectively.

The mode register 22 receives an address signal Add from a CPU (not shown) and outputs a signal corresponding to a mode to be executed, to the control logic circuit 24.

The command decoder 23 receives the address signal Add, an output of the clock generator 21, a low-active chip select signal /CS, a low-active RAS (row address strobe) signal /RAS, a low-active CAS (column address strobe) signal /CAS and a low-active write enable signal /WE, and supplies an output signal to the control logic circuit 24. Here, the RAS signal /RAS is a signal for notifying that it is going to supply the row address, and the CAS signal /CAS is a signal for notifying that it is going to supply the column address. The write enable signal /WE is a signal for permitting the writing.

The control logic circuit 24 receives the output signal of the command decoder 23, the output of the clock generator 21 and the signal outputted from the mode register 22, and generates control signals which are supplied to the row address buffer 25, the sense amplifier 32, the column address buffer 27, the data control circuit 10 and the latch circuit 11, respectively.

The row address buffer 25 holds a row address of the input address signal Add, and the column address buffer 27 holds a column address of the input address signal Add. The refresh counter 26 counts a refresh address, and the burst counter 28 counts a burst length of a read data or a write data. Here, the burst length is indicative of a maximum data length in the column address.

The bank judgment circuit 13 discriminates which of the bank A and the bank B is to be accessed at a first place. For example, if the burst length is set to be all column addresses in a specified row address in a bank (full page), the bank judgment circuit 13 can discriminate which of the bank A and the bank B is selected, since the bank address signal Add is supplied when the row address in bank is selected.

The row address counter 14 increments the row address which is to be continuously accessed in the bank A (or B) discriminated by the bank judgment circuit 13.

When the accessing of the most significant column address in the bank A (or B) at the row address designated by the row address counter 14 has been finished, the bank switch circuit 15 shifts the access to a data input/output line to be subsequently accessed in the other bank B (or A), and on the other hand, activates a row address to be next accessed in the bank A (or B) in which the access has been just finished. Thus, the bank switch circuit 15 alternately switches between the access to the bank A and the access to the bank B, so that the reading or writing operation is continuously executed.

For example, when the most significant column address in the selected bank A (or B) is incremented, the column address is supplied to the bank switch circuit 15, which then shifts the column address to for example a "0" th column address, in a row address activated in a non-selected bank B (or A). Furthermore, the bank switch circuit 15 internally generates a precharge command for data input/output lines, for reading at a row address selected when the bank is switched to a next bank, so as to automatically execute the precharging. After the precharging is completed, the row address in the selected bank is incremented in the row address counter 14, and the bank switch circuit 15 activates the incremented row address.

Furthermore, the shown semiconductor memory includes the data control circuit 10, the latch circuit 11 and an input/output buffer 12, which are coupled as shown.

The data control circuit 10 receives a signal from the control logic circuit 24 and controls the column decoder 30 and the latch circuit 11. The latch circuit 11 receives the clock signal from the clock generator 21, a signal outputted from the data control circuit 10, and a signal from the control logic circuit 24, and latches a necessary signal in response to the clock signal, so as to output the latched signal to the input/output buffer 12.

Incidentally, in FIG. 1, "DQM" designates a signal for masking an input/output data, and "DQ" shows a data input/output pin. Therefore, in the case of writing data, the data input/output pin DQ functions as a data input pin, and in the case of reading data, the data input/output pin DQ functions as a data output pin.

Figure 2:
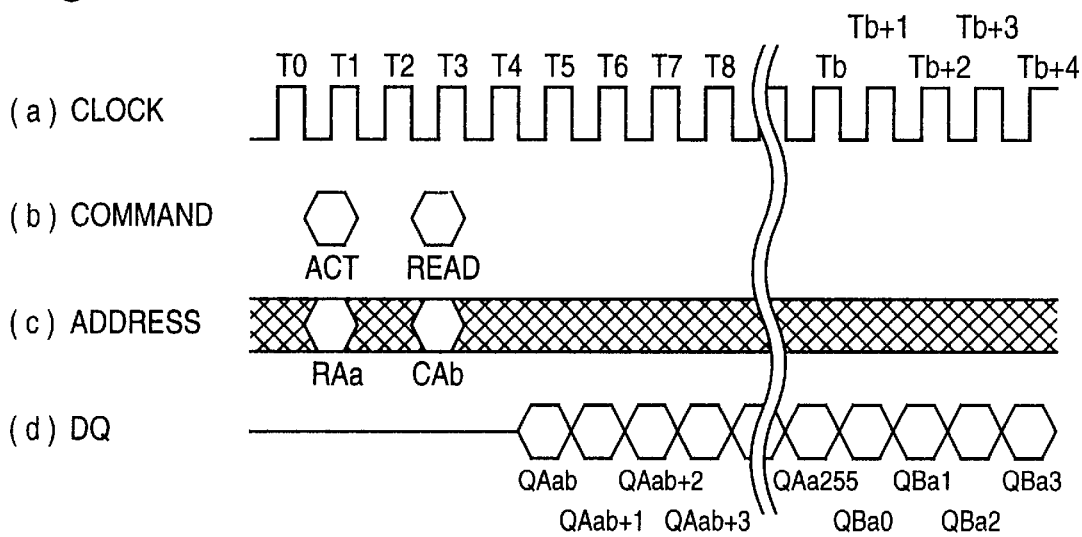
FIG. 2 is a timing chart illustrating an operation in the bank A when a final address in a column address is 255.

Now, an operation of the shown semiconductor memory will be described. First, a reading operation starting from the bank A when the burst length in the semiconductor memory is set to a full page, will be described with reference to FIG. 1 and FIG. 2 which is a timing chart illustrating an operation in the bank A when a final address in a column address is 255. FIG. 2 shows the clock signal "CLOCK", the control command "COMMAND", the bank address signal Add "ADDRESS" and the status of the data input/output pin DQ, positioned with reference to an axis of lime expressed in the axis of abscissas, based on the clock signal supplied from the clock generator 21.

As shown in (a) of FIG. 2, the clock signal is supplied with a predetermined period, as T0, ... Tb, ... Tb+4, ... . In the control command shown in (b) of FIG. 2, "ACT" indicates an active command, and "READ" shows a read command. In the address signal shown in (c) of FIG. 2, "RAa" indicates the row address "a" in the bank A, and "CAb" denotes in the column address "b" in the bank A.

Furthermore, in the data input/output pin DQ shown in (d) of FIG. 2, "QAab" is an output data from an address designated by the row address "a" and the column address "b" in the bank A, and "QAab+1" is an output data from an address designated by the row address "a" and the column address "b+1" in the bank A, and so on. "QBa0" is an output data from an address designated by the row address "a" and the column address "0" in the bank B.

First, at the time T1, if the active command "ACT" and the row address "a" of the bank A are supplied as the control command, the active command "ACT" is supplied to the command decoder 23, and the row address "a" is supplied to the row address buffer 25. As a result, the word line of the row address in the bank A selected and designated by the address signal Add is activated.

Furthermore, since the address signal Add is supplied through the row address buffer 25 to the bank judgment circuit 13, the bank judgment circuit 13 discriminates which of the bank A and the bank B is selected. On the basis of the output of the bank judgment circuit 13, the bank switch circuit 15 activates the word line which is included in a non-selected and high place bank B and which is at the same row address as the row address "a" in the bank A.

Succeedingly, at the time T3, if the read command "READ" and the column address "b" in the bank A are supplied, the read command "READ" is supplied to the command decoder 23, and the column address "b" is supplied to the column address buffer 27, so that data is outputted in synchronism with a rising edge of each of the clock signals after the time T5, as shown in FIG. 2.

A first output data is data read out from an address designated by the row address "a" and the column address "b" in the bank A, and succeeding output data is data read out by incrementing the column address by action of the burst counter 28. When the most significant column address in the bank A is incremented, this column address is supplied to the bank switch circuit 15, so that the column address to be read out is shifted to the column address "0" (the "0" th data input/output line) in the row address "a" activated in the bank B.

Furthermore, the bank switch circuit 15 internally generates a precharge command for the data input/output lines, for a reading at a next row address in the bank A for which the reading operation has just been completed, so that the precharge is automatically performed. Furthermore, the row address is incremented by the row address counter 14, so that the bank switch circuit 15 activates the word line corresponding to the incremented row address ("a+1").

Similarly, when the most significant column address in the bank B is incremented, this column address is supplied to the bank switch circuit 15, and the column address to be read out is shifted to the column address "0" (the "0" th data input/output line), in the row address "a+1" activated in the bank A.

Succeedingly, the bank switch circuit 15 internally generates a precharge command for the data input/output lines, for a reading at a next row address in the bank B for which the reading operation has just been completed, so that the precharge is automatically performed. Furthermore, the row address is incremented by the row address counter 14, so that the bank switch circuit 15 activates the word line corresponding to the incremented row address.

Thus, the reading operation is continuously and ceaselessly executed between the bank A and the bank B.

Figure 3:
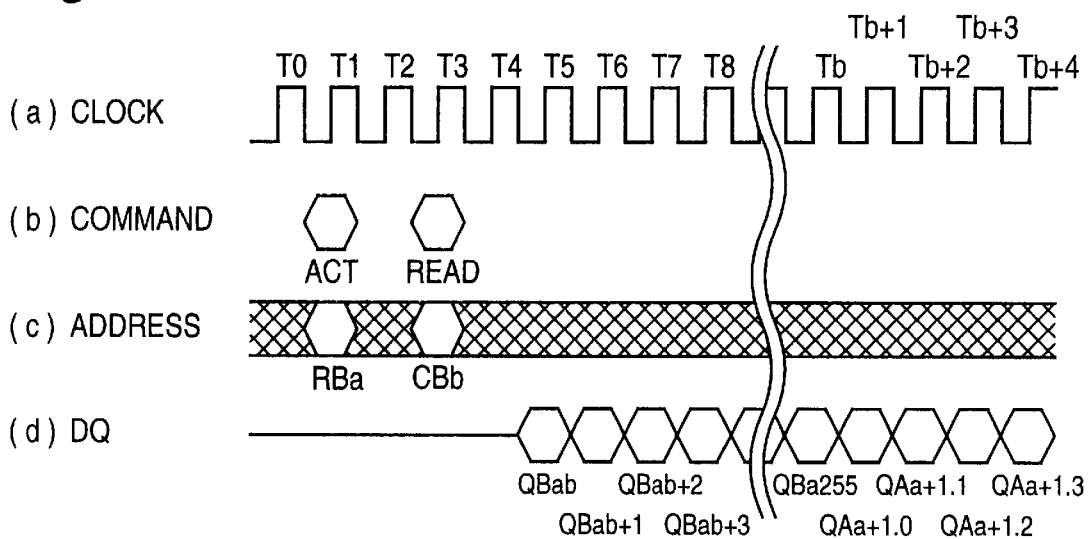
FIG. 3 is a timing chart illustrating an operation in the bank B when a final address in a column address is 255.

Next, a reading operation starting from the bank B when the burst length in the semiconductor memory is set to a full page, will be described with reference to FIG. 1 and FIG. 3 which is a timing chart illustrating an operation in the bank B when a final address in a column address is 255. FIG. 3 shows the clock signal "CLOCK", the control command "COMMAND", the bank address signal Add "ADDRESS" and the status of the data input/output pin DQ, positioned with reference to an of time expressed in the axis of abscissas, based on the clock signal supplied from the clock generator 21.

As shown in (a) of FIG. 3, the clock signal is supplied with a predetermined period, as T0, Tb, ... Tb+4, .... In the control command shown in (b) of FIG. 3, "ACT" indicates an active command, and "READ" shows a read command. In the address signal shown in (c) of FIG. 3, "RBa" indicates the row address "a" in the bank B, and "CBb" denotes in the column address "b" in the bank B.

Furthermore, in the data input/output pin DQ shown in (d) of FIG. 3, "QBab" is an output data from an address designated by the row address "a" and the column address "b" in the bank B, and "QBab+1" is an output data from an address designated by the row address "a" and the column address "b+1" in the bank B, and so on. "QAa+1,0" is an output data from an address designated by the row address "a+1" and the column address "0" in the bank A.

First, at the time T1, if the active command "ACT" and the row address "a" of the bank B are supplied as the control command, the active command "ACT" is supplied to the command decoder 23, and the row address "a" is supplied to the row address buffer 25. As a result, the word line of the row address in the bank B selected and designated by the address signal Add is activated.

Furthermore, since the address signal Add is supplied through the row address buffer 25 to the bank judgment circuit 13, the bank judgment circuit 13 discriminates which of the bank A and the bank B is selected. On the basis of the output of the bank judgment circuit 13, the bank switch circuit 15 activates the word line which is included in a non-selected and low place bank A and which is at the row address "a+1" next to the row address "a" in the bank B.

Succeedingly, at the time T3, if the read command "READ" and the column address "b" in the bank B are supplied, the read command "READ" is supplied to the command decoder 23, and the column address "b" is supplied to the column address buffer 27, so that data is outputted in synchronism with a rising edge of each of the clock signals after the time T5.

A first output data is data read out from an address designated by the row address "a" and the column address "b" in the bank B, and succeeding output data is data read out by incrementing the column address by action of the burst counter 28. When the most significant column address in the bank B is incremented, this column address is supplied to the bank switch circuit 15, and the address to be read out (the data input/output line) is shifted to the column address "0" in the row address "a+1" precharged in the bank A.

Furthermore, the bank switch circuit 15 internally generates a precharge command for the data input/output lines, for a reading at a next row address of the bank B for which the reading operation has just been completed, so that the precharge is automatically performed. Furthermore, the row address is incremented by action of the row address counter 14, so that the bank switch circuit 15 activates the word line corresponding to the incremented row address.

Similarly, when the most significant column address in the bank A is incremented, this column address is supplied to the bank switch circuit 15, and the column address to be read out is shifted to the column address "0" (the "0" th data input/output line) in the row address "a+1" activated in the bank B.

Succeedingly, the bank switch circuit 15 internally generates a precharge command for the data input/output lines, for a reading at a next row address of the bank A for which the reading operation has just been completed, so that the precharge is automatically performed. Furthermore, the row address is incremented by action of the row address counter 14, so that the bank switch circuit 15 activates the incremented row address.

Thus, the reading operation is continuously and ceaselessly executed between the bank B and the bank A.

In the case of continuously and ceaselessly executing the reading or writing operation between the bank A and the bank B in the above mentioned embodiment, when the bank is shifted from the low place bank A to the high place bank B, the row address is maintained at the same row address, but when the bank is shifted from the high place bank B to the low place bank A, the row address is shifted to a next row address.

Furthermore, when the burst length, which corresponds to a set of continuous signals or data handled as one unit in a specific rule, is set to a full page, the above mentioned embodiment includes the bank judgment circuit 13 for discriminating which bank is firstly accessed, the row address counter 14 for incrementing the row address and the bank switch circuit 15 for executing an interleave in which when continuous data is read from or written into the two banks, adjacent addresses are allocated to different banks, respectively. With this arrangement, when the burst length is set to the full page, the reading or writing operation can be ceaselessly executed alternately for the bank A and the bank B, with the result that efficiency of the control commands can be increased.

Next, a second embodiment of the present invention will be described. In the first embodiment, as mentioned above, in the case of continuously and ceaselessly executing the reading or writing operation between the bank A and the bank B, when the bank is shifted from the low place bank A to the high place bank B, the data input/output line in the low place bank A is shifted to the data input/output line in the high place bank B without changing the row address, but when the bank is shifted from the high place bank B to the low place bank A, the data input/output line in the high place bank B is shifted to the data input/output line in the low place bank A by changing the row address to a next row address. To the contrary, in this second embodiment, when the bank is shifted from the high place bank B to the low place bank A, the data input/output line in the high place bank B is shifted to the data input/output line in the low place bank A without changing the row address, and when the bank is shifted from the low place bank A to the high place bank B, the data input/output line the low place bank A is shifted to the data input/output line in the high place bank B by changing the row address to a next row address.

In order to realize the above mentioned construction of the second embodiment, the embodiment shown in FIG. 1 is modified as follows: When the bank B is selected, the bank judgment circuit 13 simultaneously activates the word line at the same row address in the non-selected bank A. When the bank A is selected, the bank judgment circuit 13 increments the row address by the row address counter 14 and simultaneously activates the word line at the incremented row address in the non-selected bank B. Thus, an advantage similar to that obtained in the first embodiment can be obtained in the second embodiment.

In the first and second embodiments, the burst length can be changed to a voluntary value (2, 4, 8, etc.). When the burst length is a voluntary value other than the full page, the reading or writing operation can be ceaselessly executed at a voluntary data length alternately for a plurality of banks.

Furthermore, differently from the prior art semiconductor memory operating based on complicated commands from a CPU or another, the first and second embodiments can automatically continuously execute the reading or writing operation between the bank A and the bank B if it receives a special control command from the CPU or another. Therefore, even if the operating frequency is further elevated, the embodiments of the present invention can avoid inconvenience that the control command trains become a heavy load in an access control. Furthermore, since the reading or writing operation can be continuously executed for the whole of the memory cell arrays, regardless of the column length in one row address, when a large amount of data can be continuously read or written, efficiency of the control commands can be increased.

Incidentally, the first and second embodiments include two banks of the bank A and the bank B. However, the present invention can be applied to a semiconductor device having three or more banks, and in these cases, an advantage similar to that obtained in the first and second embodiment can be obtained.

The invention has thus been shown and described with reference to the specific embodiments. However, it should be noted that the present invention is in no way limited to the details of the illustrated structures but changes and modifications may be made within the scope of the appended claims.

The content of Japanese Patent Application No. Heisei 10-317628 filed on Nov. 9, 1998 including the specification, claims and drawings, is incorporated by reference in its entirety into this application.

What is claimed is:

1. A semiconductor memory comprising:
   at least two banks each including a number of memory cells arranged in the form of a matrix having a plurality of rows and a plurality of columns, each of said banks having a plurality of data input/output lines extending in a column direction, so that said data input/output lines can sequentially accessed at a designated row address;
   a bank judgment circuit receiving an address signal for discriminating a first bank to be firstly accessed of said at least two banks;
   a row address counter for designating a row address at which said first bank is continuously accessed; and
   a bank switch means for switching access to a second bank to continuously access to said second bank after an access to the most significant column address in said first bank has been finished;
   whereby a reading or writing operation is continuously executed for said first bank and said second bank by alternately accessing said first bank and said second bank.

2. A semiconductor memory claimed in claim 1 wherein said first bank is a low place bank in a bank address, and said second bank is a high place bank in the bank address, and wherein when the access is shifted from the low place bank to the high place bank, said bank switch means activates the same row address, and when the access is shifted from the high place bank to the low place bank, said bank switch means activates a row address next to the row address for which the access was finished.

3. A semiconductor memory claimed in claim 1 wherein said first bank is a low place bank in a bank address, and said second bank is a high place bank in the bank address, and wherein when the access is shifted from the high place bank to the low place bank, said bank switch means activates the same row address, and when the access is shifted from the low place bank to the high place bank, said bank switch means activates a row address next to the row address for which the access was finished.

4. A semiconductor memory comprising at least two banks each including a number of memory cells arranged in the form of a matrix having a plurality of rows and a plurality of columns, each of said banks having a plurality of data input/output lines extending in a column direction, so that said data input/output lines can sequentially accessed at a designated row address, wherein the semiconductor memory is configured to receive an address signal for discriminating a first bank to be firstly accessed of said at least two banks, and to designate a row address at which said first bank is continuously accessed, and after an access to the most significant column address in said first bank has been finished, the semiconductor memory switches access to a second bank to continuously access to said second bank, whereby a reading or writing operation is continuously executed for said first bank and said second bank by alternately accessing said first bank and said second bank.

* * * * *